United States Patent [19]
Witmer

[11] Patent Number: 5,606,482
[45] Date of Patent: Feb. 25, 1997

[54] SOLID STATE CIRCUIT BREAKER

[75] Inventor: Steven B. Witmer, Spring Township, Berks County, Pa.

[73] Assignee: Lucent Technologies Inc., Murray Hill, N.J.

[21] Appl. No.: 422,566

[22] Filed: Apr. 14, 1995

[51] Int. Cl.⁶ .................................................. H02H 9/00
[52] U.S. Cl. ................................ 361/93; 361/57; 361/101
[58] Field of Search ............................ 361/93, 101, 100, 361/57, 56

[56] References Cited

U.S. PATENT DOCUMENTS

| | | | |
|---|---|---|---|
| 4,477,747 | 10/1984 | Wakai | 315/200 A |
| 4,581,540 | 4/1986 | Guajardo | 361/93 |
| 4,924,344 | 5/1990 | Guajardo | 361/101 |

*Primary Examiner*—Jeffrey A. Gaffin
*Assistant Examiner*—Sally C. Medley
*Attorney, Agent, or Firm*—Scott W. McLellan

[57] ABSTRACT

A solid state circuit breaker which provides high voltage isolation between a control circuit and a power source is described. The circuit breaker comprises a receiver for providing a control signal in response to a transmitter that is electrically isolated from the receiver, a solid state switch that closes in response to the control signal thereby allowing a load current to flow through the switch, a current sensor for measuring the load current, and an inhibit circuit responsive to the current sensor for inhibiting the control signal when the load current exceeds a predetermined magnitude thereby opening the switch without adjusting the transmitter. After opening the switch, the inhibit circuit is responsive to the transmitter for allowing the control signal thereby closing the switch.

1 Claim, 4 Drawing Sheets

5,606,482

SOLID STATE CIRCUIT BREAKER

FIELD OF THE INVENTION

This invention relates to circuit breakers, and more particularly to a solid state circuit breaker with high voltage isolation between a control circuit and a power source.

BACKGROUND OF THE INVENTION

Protective systems are designed to respond to faults such as short circuits in order to protect faulty equipment and associated circuits, power supplies and human operators from the consequences of current overload. There are many ways of de-energizing faulty equipment depending on factors such as zones of protection, relay speed, and reliability. Circuit breakers and fuses are commonly used to block a load current after it exceeds a predetermined magnitude known as break current. Fuses must be replaced when blown which implies a long duration outage. Circuit breakers are reset rather than replaced.

Mechanical circuit breakers often employ contacts that are pulled apart under excessive current and subsequently closed by pushing a reset button. Mechanical circuit breakers include thermal circuit breakers in which a thermal metal strip bends under high current to open the contacts. Mechanical circuit breakers also include magnetic circuit breakers which develop a sufficient magnetic field in a coil of wire under high current to activate a spring trigger mechanism to pull the contacts apart.

Solid state circuit breakers, that is, circuit breakers using solid state components, have been developed to provide advantages over mechanical circuit breakers. These advantages include faster response, smaller size, more accurate thresholds, quieter operation, and higher reliability. See, for instance, U.S. Pat. Nos. 5,221,847 and 3,668,483, "IC Functions As Programmable Electronic Circuit Breaker", Electronic Products, Jul. 1994, p. 79, and "Build Solid-State Circuit Breaker", Electronic Design, Jul. 22, 1993, p. 88.

Circuit breakers may be reset either automatically or by external means. Automatically resetting circuit breakers normally constrain the power source, for instance by requiring a minimum load current for load current to flow or requiring zero load voltage for reset to occur. In the event a circuit breaker is reset externally, whether by a computer or a human operator, it is essential that adequate electrical isolation be provided between the control circuit (input circuit) and the power source (output circuit). This concern is particularly acute with solid state circuit breakers. In solid state components, voltage isolation is often provided by gate oxide layers in metal-oxide-semiconductor (MOS) devices. Gate oxide layers are normally relatively thin to allow low turn-on threshold values. As a result, typical voltage isolation for gate oxide layers in on the order of 80–100 volts. Even gate oxide layers specially designed for high voltage isolation are usually incapable of withstanding more than a few hundred volts. A power surge that causes a high voltage to pierce a gate oxide layer and energize the control circuit could be catastrophic. Various solutions have been proposed. For example, U.S. Pat. No. 3,668,483 employs a circuit breaker with an isolated control source, but the circuit is limited to dc load currents, uses a mechanical relay, and requires power from the load to operate a switch.

Thus, there is a need for a solid state circuit breaker which retains the aforementioned advantages over mechanical circuit breakers while providing high voltage isolation between the control circuit and the power source, bi-directional load currents, and few constraints on the power source.

SUMMARY OF THE INVENTION

A primary aspect of the invention is a solid state circuit breaker with high voltage isolation between a control circuit and a power source.

An embodiment of the invention is a solid state circuit breaker comprising a receiver for providing a control signal in response to a transmitter that is electrically isolated from the receiver, a solid state switch that closes in response to the control signal thereby allowing a load current to flow through the switch, a current sensor for measuring the load current, and an inhibit circuit responsive to the current sensor for inhibiting the control signal when the load current exceeds a predetermined magnitude thereby opening the switch without adjusting the transmitter. After the inhibit circuit opens the switch, the inhibit circuit is responsive to the transmitter for allowing (i.e. no longer inhibiting) the control signal thereby closing the switch. In this manner, a separate control circuit controlling the transmitter is coupled via a high voltage isolation barrier to the power source so that the inhibit circuit opens the switch in response to excessive output current and then closes the switch in response to the control circuit.

In certain embodiments of the invention the transmitter and receiver may communicate by capacitive charge coupling, magnetic coupling or optical coupling, the inhibit circuit may include a bistable device such as a thyristor which triggers in response to the current sensor thereby opening the switch, and a discharge circuit may accelerate opening the switch. The invention is well-suited for both uni-directional (dc) and bi-directional (ac) load currents.

Since the inhibit circuit opens the switch independently of the transmitter, a feedback loop from the power source to the transmitter is not needed to break the load current. This allows for rapid response time. In addition, the transmitter may provide essentially all the power for opening and closing the switch. This avoids power drain from the power source and various power source constraints (such as minimum load currents).

These and other aspects of the invention will be apparent from the detailed description and the drawings.

BRIEF DESCRIPTION OF THE DRAWING

The invention, together with its various features and advantages, can be readily understood from the following detailed description taken in conjunction with the accompanying drawings, in which.

DETAILED DESCRIPTION

Figure 1:
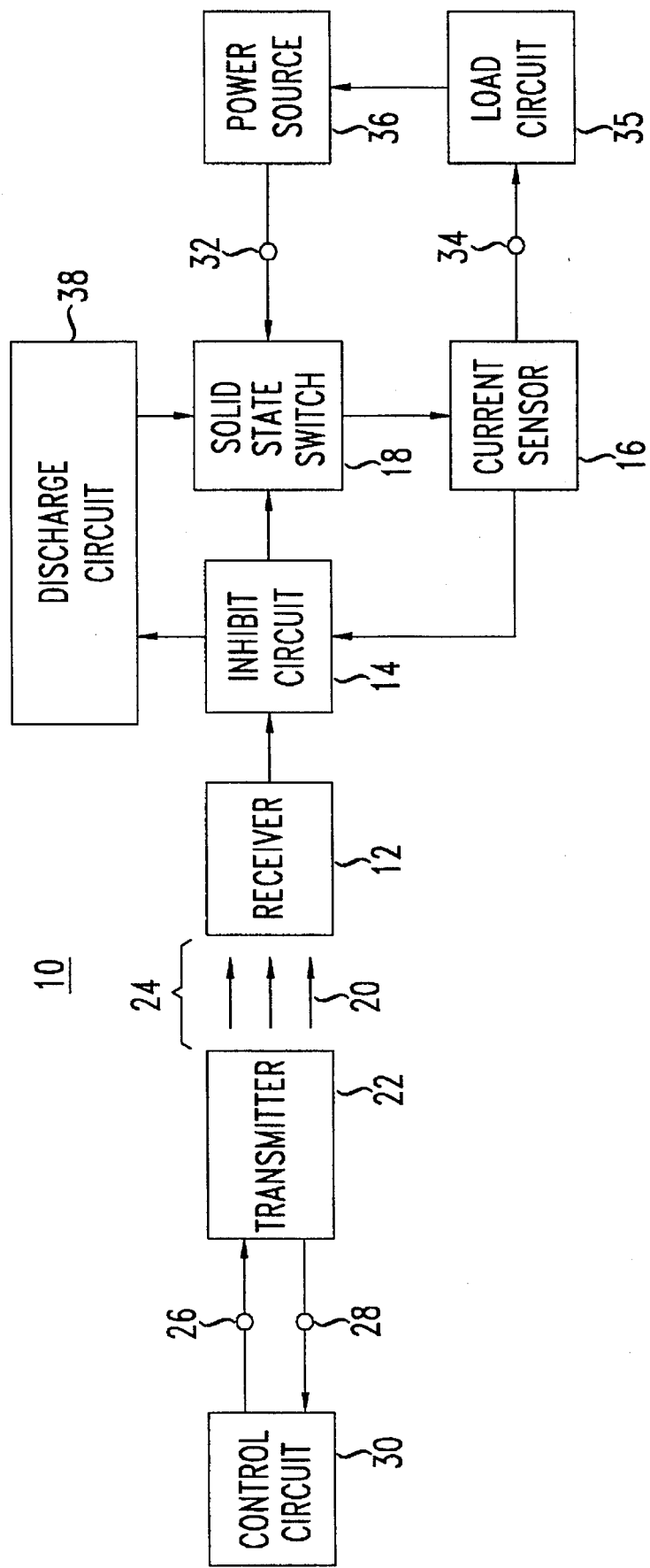
FIG. 1 is a simplified schematic block diagram of an exemplary embodiment of the present invention.

With reference to FIG. 1, a simplified schematic block diagram of an exemplary embodiment of the present invention is shown. FIG. 1 discloses the general operation of the embodiment and the environment in which it operates. As is seen, circuit breaker 10 includes receiver 12, inhibit circuit 14, current sensor 16 and solid state switch 18. Receiver 12 receives transmission 20 sent by transmitter 22 across electrical isolation barrier 24. Transmitter 22 is connectable at terminals 26 and 28 to control circuit 30 for controlling the transmission. Isolation barrier 24 electrically isolates transmitter 22 from receiver 12 while permitting passage of transmission 20. Preferably, the isolation is at least and generally on the order of several thousand volts. Communication techniques which maintain adequate electrical isolation include, but are not limited to, capacitive charge coupling, magnetic coupling, and optical coupling. In response to transmission 20, receiver 12 provides a control signal. The control signal closes normally-open switch 18. The series connection of current sensor 16 and switch 18 are connectable at terminals 32 and 34 to the series connection of load circuit 35 and power source 36. Power source 36 produces a load voltage at terminals 32 and 34, and a load current flows when switch 18 closes.

If, however, the load current exceeds a predetermined magnitude, or break current, then current sensor 16 signals inhibit circuit 14 to inhibit the control signal and rapidly open switch 18 without adjusting (i.e. changing the operation of) transmitter 22. Likewise, transmission 20 need not be altered or disturbed. Since feedback from power source 36 to control circuit 30 is not necessary to open switch 18, control circuit 30 is well protected from power surges arising at power source 36. Circuit breaker 10 preferably includes discharge circuit 38 to accelerate opening switch 18. After inhibit circuit 14 opens switch 18, switch 18 subsequently closes in response to transmitter 20. Preferably, the control circuit instructs the transmitter to close (and thus reset) the switch by disabling and then enabling the transmission. Disabling and enabling the transmission generates a new control signal. Inhibit circuit 14 will not inhibit the new control signal unless current overload persists. That is, if, after reset, the load current continues to exceed the predetermined magnitude then the switch will rapidly open again as described above.

Performing the reset operation independently of the power source eliminates the need for feedback from the power source to control circuit. Using feedback, however, from power source 36 to control transmitter 22 after inhibit circuit 14 opens switch 18 is within the scope of the invention. Any such feedback would preferably include a high voltage isolation barrier such as barrier 24.

Figure 2:
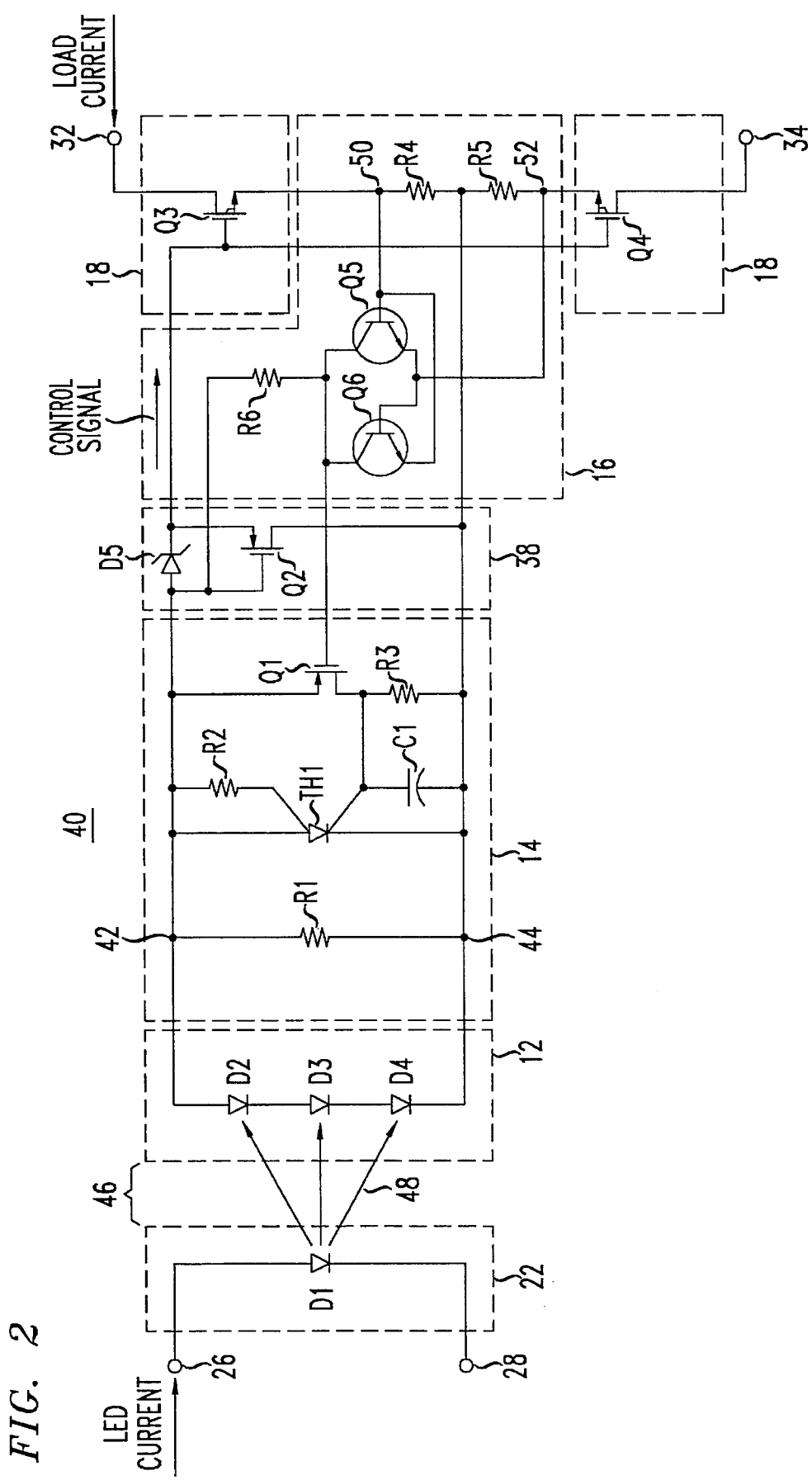
FIG. 2 is a simplified circuit diagram in accordance with one exemplary embodiment of FIG. 1.

Referring to FIG. 2, there is shown a simplified circuit diagram of a circuit in accordance with one exemplary embodiment of FIG. 1. The circuit components, interconnections, and operations, as described below, illustrate a manner in which the invention can be implemented. In circuit 40, transmitter 22 comprises light emitting diode (LED) D1 coupled to terminals 26 and 28 which are connectable to a control circuit (not shown) for supplying LED current to activate the LED. The control circuit may range from an automated digital system to a simple normally-closed mechanical switch in series with a battery. Receiver 12 is shown as a photodiode array comprising photodiodes D2, D3 and D4 stacked in series between nodes 42 and 44. The isolation barrier is shown illustratively as air gap 46 between the LED and photodiode array. Gap 46 permits the passage of optical signal 48. Inhibit circuit 14 includes resistor R1 connected in parallel across nodes 42 and 44, gate turn-off thyristor TH1 with an anode connected to node 42 and a cathode connected to node 44. Inhibit circuit 14 further includes resistor R2 connected between node 42 and the N-type biasing gate of the thyristor, capacitor C1 and resistor R3 connected in parallel between the P-type trigger gate of the thyristor and node 44, and PMOS field effect transistor Q1 with a source connected to node 42 and a drain connected to the trigger gate. Discharge circuit 38 includes diode D5 with an anode connected to node 42, and PMOS field effect transistor Q2 with a gate connected to node 42, a source connected to the cathode of diode D5, and a drain connected to node 44.

Switch 16 comprises DMOS field effect transistors Q3 and Q4. DMOS FETs are doubly diffused NMOS devices, containing an integral diode between the source and drain, designed to withstand high drain-to-source voltages at a cost of increased channel resistance. For relatively small load voltages, non doubly diffused NMOS devices may be preferred. The drains of transistors Q3 and Q4 are connected to terminals 32 and 34, respectively, whereas the gates of transistors Q3 and Q4 are connected to the cathode of diode D5. Terminals 32 and 34 are connectable to any power source that generates a load current to be controlled. Current sensor 16 includes resistors R4, R5 and R6 and NPN bipolar transistors Q5 and Q6. Resistors R4 and R5 are connected in series between the sources of transistors Q3 and Q4 at nodes 50 and 52, respectively. Node 44 is connected to the junction between resistors R4 and R5. Transistor Q5 has a base connected at node 50 to the source of transistor Q3 and an emitter connected at node 52 to the source of transistor Q4. Transistor Q6 has a base connected at node 52 to the source of transistor Q4 and an emitter connected at node 50 to the source of transistor Q3. The collectors of transistors Q5 and Q6 are connected to the gate of transistor Q1, and resistor R6 is connected between the collectors and node 42.

In operation, when the control circuit supplies an LED current through terminals 26 and 28, LED D1 transmits optical signal 48 across gap 46. Signal 48 strikes photodiodes D2–D4 which convert signal 48 into a photocurrent resulting in a positive first voltage across node 42 with respect to node 44. The first voltage provides a control signal which causes a positive gate-to-source voltage to turn on transistors Q3 and Q4 thereby closing switch 18.

For illustration purposes, assume a small load current (less than the predetermined magnitude) flows from terminal 32 to terminal 34. In this condition, transistors Q5 and Q6 are turned off, the collectors of transistors Q5 and Q6 and the gate of transistor Q1 are pulled high by resistor R6, and transistor Q1 is turned off. As a result, the voltage at the trigger gate of thyristor TH1 is pulled low by resistor R3 and the thyristor remains off (forward blocking mode). Capacitor C1 prevents momentary voltage spikes through circuit 40 from turning on the thyristor. Resistor R2 reduces the thyristor's sensitivity to false turn-on. Since diode D5 is forward biased, transistor Q2 is turned off. Resistor R1 has large resistance to reduce waste of photocurrent, whereas resistors R4 and R5 have low resistance to reduce power dissipation from the load current. As long as the photodiode array supplies sufficient photocurrent to maintain the control signal and the load current fails to exceed the predetermined magnitude, circuit 40 will remain in this condition.

On the other hand, if the load current from terminal 32 to terminal 34 exceeds the predetermined magnitude, then transistor Q5 turns on and pulls down on the gate of transistor Q1. Transistor Q1 turns on and supplies current to the trigger gate. Resistor R3 has a large resistance so that transistor Q1 pulls the trigger gate high to turn on the thyristor (forward conduction mode). When the thyristor turns on, a substantial portion of the photocurrent is abruptly shunted through the thyristor and a second voltage, less than the first voltage, is immediately developed across node 42 with respect to node 44. The second voltage is insufficient to turn on transistors Q3 and Q4. Therefore, the thyristor inhibits (or overrides) the control signal and transistors Q3 and Q4 turn off. Connecting the gates of transistors Q3 and Q4 directly to node 42 would also accomplish this result, but the large gate-to-source capacitances in transistors Q3 and Q4 might unduly delay turn-off time. Discharge circuit 38 accelerates this process. As the voltage at node 42 is reduced, transistor Q2 turns on and rapidly transfers charge stored in the gates of transistors Q3 and Q4 to node 44. In this manner, transistor Q2 acts as a "source follower" to node 42. As transistors Q3 and Q4 turn off, transistors Q5 and Q1 turn off as well. The thyristor, however, remains on (since a pulse at the trigger gate has already initiated conduction) as long as the photocurrent furnishes the holding current of the thyristor. The holding current is determined by the voltage drop across the anode-bias gate (first intrinsic PN junction in thyristor) divided by the resistance of resistor R2.

Thus, when the load current exceeds the predetermined amount, transistors Q3 and Q4 turn off independently of the control circuit. Essentially no power from the power source is required to turn off transistors Q3 and Q4. In addition, transistors Q3 and Q4 remain off while the thyristor is on. Removing the LED current deactivates the photodiode array, and charge stored in the photodiode array is drained through the thyristor and resistor R1. Since these stored charges are relatively small, resistor R1 may have a relatively high resistance and still maintain a small RC time constant. It is noted that diode D5 decouples resistor R1 from the gates of transistors Q3 and Q4 to avoid a large RC time constant. Thus, removing the LED current both turns off the thyristor and eliminates the control signal. After the thyristor turns off, and the LED current is reapplied, a new control signal is generated. The thyristor will not inhibit the new control signal unless the load current again exceeds the predetermined magnitude. Accordingly, after the thyristor inhibits the control signal, the control circuit turns off then turns on (recycles) the LED to disable and then to enable the optical signal. This reinstates the control signal and recloses the switch. This occurs independently of the power source. If, upon reset, the load current exceeds the predetermined magnitude, then the circuit will operate as previously described by turning on the thyristor and opening the switch until the optical signal is disabled and enabled again by the control circuit.

If only uni-directional load current is anticipated, then either transistor Q5 or Q6 may be eliminated, depending on the direction of current flow. For bi-directional load currents, bi-directional current sensing is preferred via transistors Q5 and Q6. The amount of voltage isolation between the reset and power sources is a matter of design choice, depending on factors such as gap size and filler materials disposed in the gap. While a thyristor is illustrated, other bistable devices such as silicon controlled rectifiers, triacs, and two-transistor combinations can perform a similar function. In addition, circuit 40 can be readily adapted for residential usage with 10–20 amp break currents. Preferably, the size of transistor Q2 is scaled to the size of transistors Q3 and Q4 (which are scaled to the load current) to match discharge capability with the amount of stored charge.

The following approximate and exemplary values are suggested for circuit 40:

| | |
|---|---|
| Resistor R1 | 15 megohm |
| Resistor R2 | 500 kilohm |
| Resistor R3 | 2 megohm |
| Resistor R4 | 3.3 ohm |
| Resistor R5 | 3.3 ohm |
| Resistor R6 | 500 kilohm |
| Capacitor C1 | 10 picofarad |
| Isolation voltage | 3750 volts |
| First voltage | 13 volts |
| Second voltage | 0.7 volt |
| Transistor Q3 threshold | 2 volts |
| Transistor Q4 threshold | 2 volts |
| Transistor Q5 saturation current | $10^{-17}$ amp |
| Transistor Q6 saturation current | $10^{-17}$ amp |
| Predetermined magnitude | 100 milliamps |
| Current | 10 milliamps |
| Photocurrent (thyristor on) | 8 microamps |
| Holding current (thyristor on) | 1.2 microamps |
| Response time (crowbar) | 50 microseconds |

It will be appreciated that the values listed above are based on idealized circuit operation indicated by circuit simulation; however, relatively minor variations will not substantially affect the operation of circuit 40. In particular, the values of resistors R4 and R5 are inversely proportional to the predetermined magnitude.

Exceeding the predetermined magnitude requires sufficient load current to turn on transistor Q5 or Q6 sufficiently hard to turn on transistor Q1. Assume, for example, a load current flowing from terminal 32 to terminal 34. The predetermined magnitude can be calculated as follows:

$$\text{Predetermined Magnitude} = K \cdot T \cdot \ln(V_{thQ2}/(R6 \cdot I_{satQ5}))/(q \cdot (R4+R5)) \quad (1)$$

where K=Boltzmann's constant, T=absolute temperature (kelvin), q=electronic charge (coulombs), $V_{thQ2}$=threshold voltage of transistor Q2, and $I_{satQ5}$=saturation current of transistor Q5. If, for example, a predetermined magnitude of 100 mA is desired, given $K=1.38 \cdot 10^{-23}$ joules per kelvin, $q=1.6 \cdot 10^{-19}$ coulombs, $V_{thQ2}=0.8$ volts, R6=500 kilohms, $I_{satQ5} 10^{-17}$ amps, and T=300 kelvin (room temperature), resistors R4 and R5 are calculated to be approximately 3.3 ohms each. For load current flowing from terminal 34 to terminal 32, $I_{satQ6}$ can be substituted for $I_{satQ5}$ in equation (1). Preferably, transistors Q5 and Q6 are matched such that the substitution does not alter equation (1).

Figure 3:
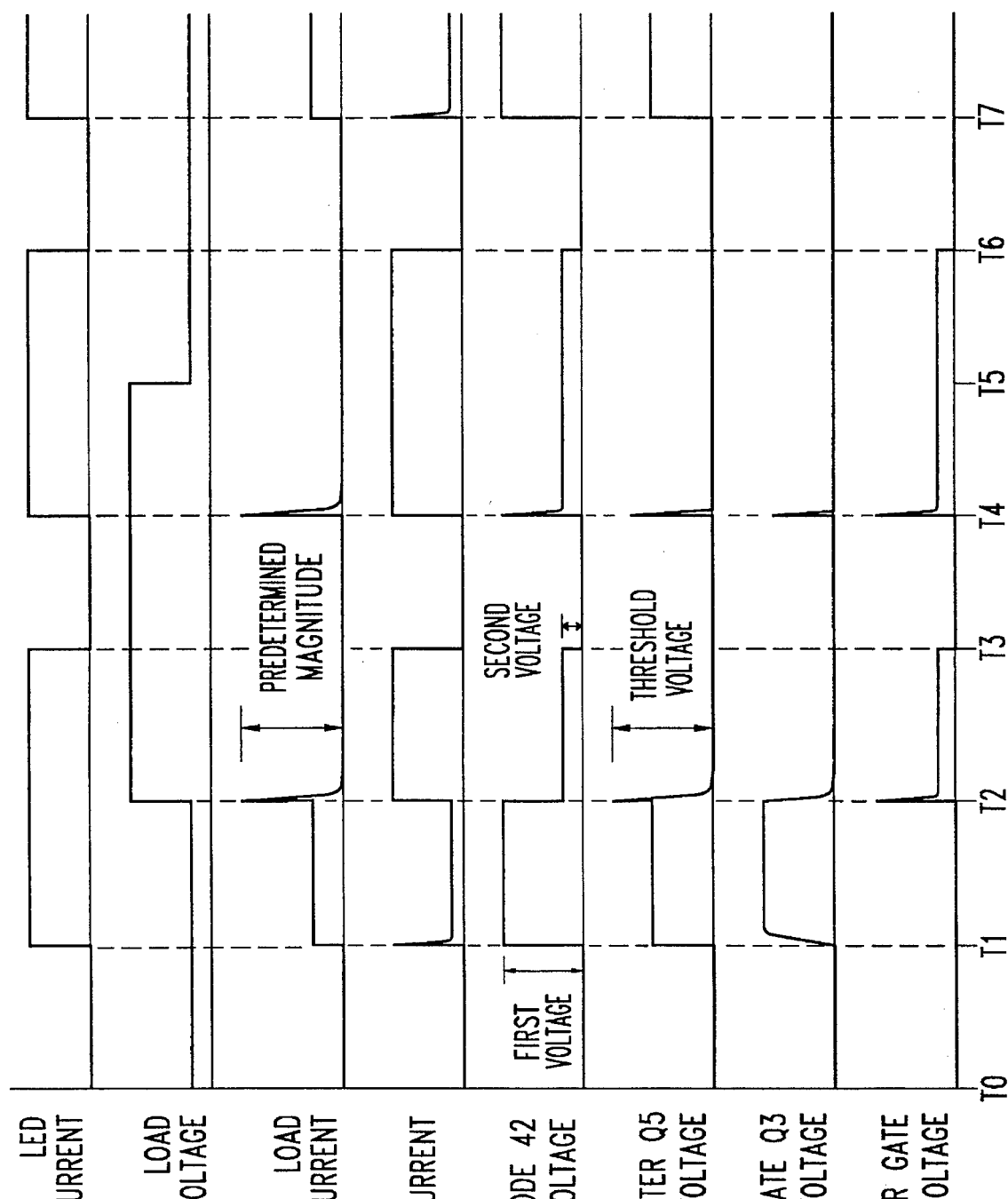
FIG. 3 is an exemplary waveform timing diagram (not drawn to scale) showing the operation of the circuit of FIG. 2.

Referring to FIG. 3, the operation of the circuit 40 is described in conjunction with exemplary timing diagrams (not drawn to scale). The timing diagrams illustrate various reactions in circuit 40 in response to changes in the LED current and load voltage. All voltages except for the load voltage and the base-emitter voltage of Q5 are taken with respect to node 44.

At time T0 the LED current is off thereby closing transistors Q3 and Q4 and blocking the load current despite the presence of load voltage. At time T1 the control circuit generates the LED current which activates the LED to send an optical signal to the photodiode array resulting in a photocurrent which generates the first voltage at node 42 and turns on transistors Q3 and Q4. The photocurrent rapidly diminishes as the gates of transistors Q3 and Q4 are charged. The load current is less than the predetermined magnitude, the base-emitter voltage of transistor Q5 remains below its bias voltage, and the thyristor gate remains low. At time T2 the load voltage surges and consequently the load current exceeds the predetermined magnitude. As a result, the base-emitter voltage of transistor Q5 exceeds the bias voltage, transistor Q5 turns on transistor Q1, and the trigger gate signals the thyristor to turn on which reduces the first voltage to the second voltage and activates the discharge circuit to rapidly turn off transistors Q3 and Q4 and block the load current. In addition, the photocurrent increases due to the thyristor providing a low resistance shunt between nodes 42 and 44. At time T3 the LED current ceases. At time T4 the LED current is reinstated thereby turning on transistors Q3 and Q4. Since, however, the load voltage is still excessive, the load current shoots above the predetermined magnitude and transistors Q3 and Q4 rapidly turn off again. At time T5 the load voltage drops (independently of circuit 40) and at times T6 and T7 the control circuit recycles the LED (independently of the load current). At time T7, the load current is permitted to flow since it fails to exceed the predetermined magnitude.

Figure 4:
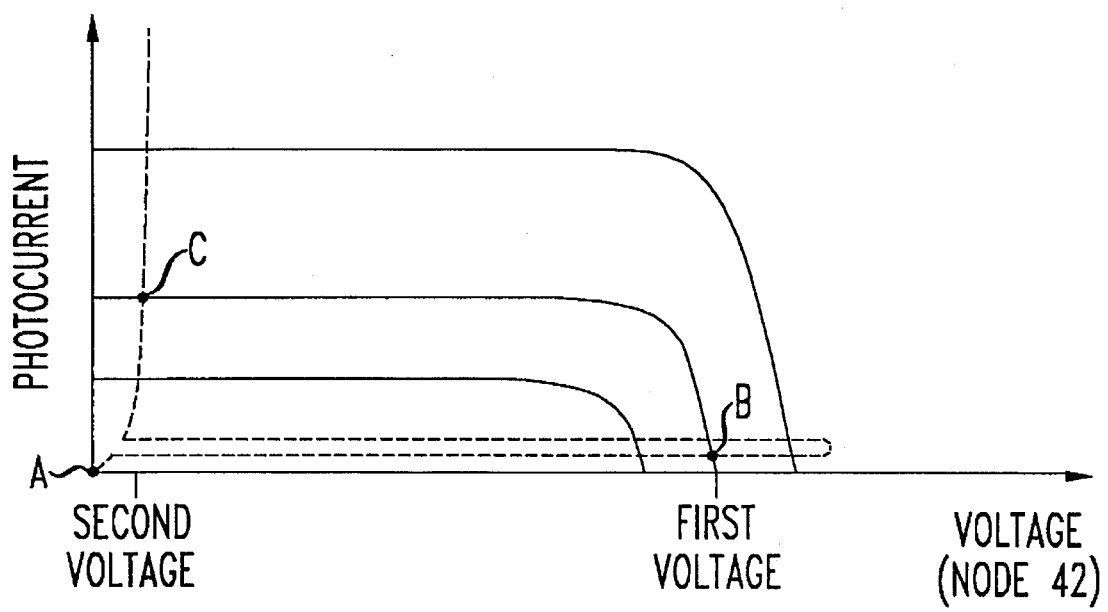
FIG. 4 is an exemplary current-voltage graph (not drawn to scale) with characteristics of the thyristor superimposed on characteristics of the photodiode array in the circuit of FIG. 2.

Referring to FIG. 4, in conjunction with FIGS. 2 and 3, there is shown an exemplary current-voltage graph (not drawn to scale) with characteristics of the thyristor (shown as dashed lines) superimposed on characteristics of the photodiode array (shown as solid lines). Comparing the current-voltage relationship of the thyristor with that of the photodiode array helps illustrate the operation of circuit 40. At time T0 the photodiode array is dormant and the thyristor is off, as seen at point "A". At time T1 the photodiode array is activated and the gates of transistors Q3 and Q4 are charged though the thyristor remains off and the curve is swept to the first voltage shown at point "B". At time T2 the thyristor turns on and the curve is swept from the first voltage to the second voltage as the thyristor shunts photocurrent as shown at point "C". As is seen, the photocurrent increases significantly. In addition, the photocurrent is relatively constant at low voltages thereby maintaining the thyristor holding current as the thyristor turns on. Finally, at time T3 the control circuit disables the LED thereby turning off the photodiode array and the curve is swept back to point "A".

Figure 5:
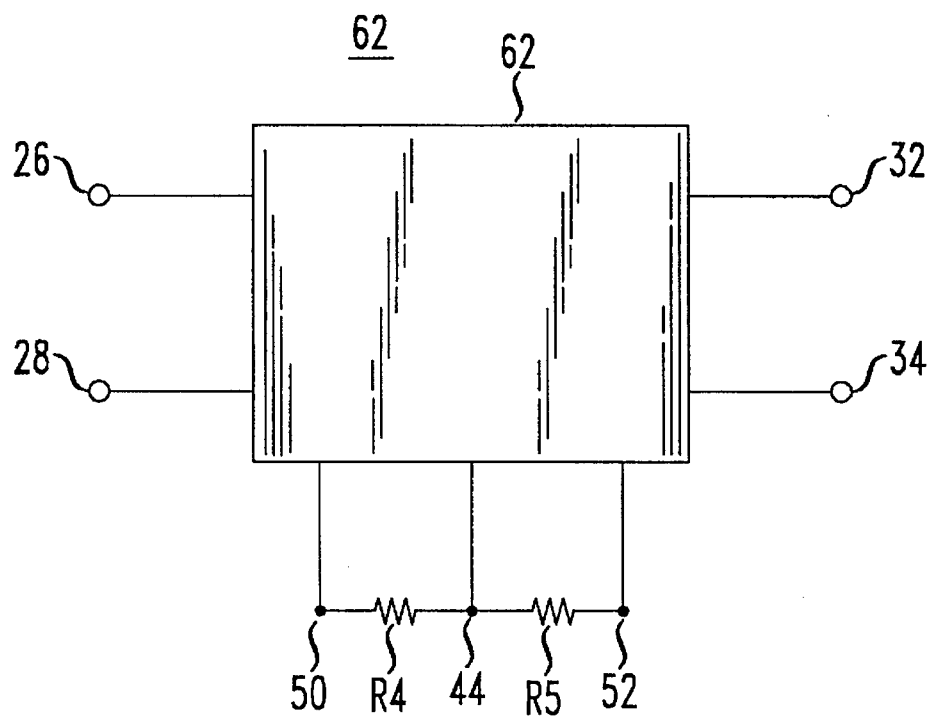
FIG. 5 is a simplified schematic block diagram of an assembly for the circuit of FIG. 2.

Referring to FIG. 5, there is shown a simplified schematic block diagram of an assembly for circuit 40. Assembly 60 illustrates how the components of circuit 40 can be bundled to handle relatively large load currents. In FIG. 5, for illustration purposes, the desired predetermined magnitude is 1 amp (instead of 100 milliamps). Accordingly, resistors R4 and R5 have values of 0.33 ohms (instead of 3.3 ohms) as per equation (1) above. Fabricating 0.33 ohm resistors on an integrated circuit chip may require expensive precision processing. Hence, for illustration purposes, resistors R4 and R5 are shown as discrete components mounted externally to metal housing 62. The remaining components of circuit 40 are disposed within housing 62. Preferably, all the remaining components except for the LED are fabricated on a single integrated circuit chip (not shown) inside housing 62. The LED may be mounted above photodiodes D2–D4 disposed on the surface of the chip. Housing 62 has an area of approximately two square centimeters and a thickness of approximately 0.5 centimeters. It is noted that housing 62 is well suited to allowing the user to select appropriate values of resistors R4 and R5 to obtain the desired predetermined magnitude.

Of course other assemblies may suitably employ the invention. In particular, certain embodiments of the invention may be disposed entirely on a single integrated circuit chip. For example, an optical emitter and optical receiver may be integral to a chip. Furthermore, a modified circuit 40 with capacitive charge coupling replacing the LED and photodiode array would be well suited to single chip fabrication. Whether or not resistors R4 and R5 are disposed on the chip is a matter of design choice. In addition, optional feedback circuitry can be employed to recycle the LED after inhibit circuit 14 opens switch 18.

Having described the preferred embodiments of this invention, it will now be apparent to one of skill in the art that other embodiments incorporating the concept may be used. Therefore, this invention should not be limited to the disclosed embodiment, but rather should be limited only by the spirit and scope of the appended claims.

I claim:

1. An optically coupled solid state circuit breaker which provides high voltage isolation between a control circuit and a power source, comprising a light emitting diode having terminals connectable to a control circuit for generating light in response to a current;

a photodiode array for converting light generated by the light emitting diode into a photocurrent across first and second nodes;

a solid state switch comprising
a first field effect transistor with a first gate, first source and first drain, and
a second field effect transistor with a second gate, second source and second drain, the first and second gates connected together and coupled to the first node, the first and second drains having terminals connectable to a power source which generates a load current,
wherein the photocurrent produces a first voltage across the nodes which turns on the first and second field effect transistors thereby allowing the load current to flow;

a current sensor comprising
a first resistor connected between the first source and the second node,
a second resistor connected between the second source and the second node,
a first bipolar transistor with a first base connected to the first source, with a first emitter connected to the second source, and with a first collector,
a second bipolar transistor with a second base connected to the second source, with a second emitter connected to the first source, and with a second collector connected to the first collector, and
a third resistor connected between the first node and the collectors,
such that when the load current flowing from the first source to the second source exceeds the predetermined magnitude then the first bipolar transistor turns on thereby providing a low voltage at the collectors, and when the load current flowing from the second source to the first source exceeds the predetermined magnitude then the second bipolar transistor turns on thereby providing the low voltage at the collectors;

an inhibit circuit comprising
a third field effect transistor with a third gate, third source and third drain, the third gate connected to the collectors, and the third source connected to the first node,
a fourth resistor connected between the second node and the third drain, and a thyristor with an anode connected to the first node, with a cathode connected to the second node, and with a trigger gate connected to the third drain, wherein the low voltage at the collectors turns on the third field effect transistor which signals the trigger gate to turn on the thyristor thereby reducing the first voltage to a second voltage across the nodes which causes the first and second field effect transistors to turn off thereby opening the switch and blocking the load current, the thyristor remaining on until the control circuit turns off the light emitting diode; and a discharge circuit comprising a second diode with a second anode connected to the first node and with a second cathode connected to the first and second gates, and a fourth field effect transistor with a fourth gate, fourth source and fourth drain, the fourth gate connected to the first node, the fourth source connected to the first and second gates, and the fourth drain connected to the second node, wherein the first voltage turns off the fourth field effect transistor whereas the second voltage turns on the fourth field effect transistor which then rapidly transfers charge stored in the first and second gates to the second node thereby accelerating turning off the switch when the thyristor turns on.

* * * * *